United States Patent
Chen et al.

(10) Patent No.: US 8,243,510 B2
(45) Date of Patent: Aug. 14, 2012

(54) NON-VOLATILE MEMORY CELL WITH METAL CAPACITOR

(75) Inventors: Andrew Chen, Redondo Beach, CA (US); Bibhudatta Sahoo, San Diego, CA (US); Ali Anvar, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 633 days.

(21) Appl. No.: 11/514,029

(22) Filed: Aug. 30, 2006

(65) Prior Publication Data

US 2008/0054331 A1 Mar. 6, 2008

(51) Int. Cl.
*G11C 11/34* (2006.01)

(52) U.S. Cl. ............... 365/185.01; 365/185.14; 257/315

(58) Field of Classification Search ............ 365/185.01, 365/185.14, 185.26, 104, 149, 212; 257/315, 257/314, 316

See application file for complete search history.

(56) References Cited

U.S. PATENT DOCUMENTS

| | | | | |
|---|---|---|---|---|
| 4,402,064 A * | 8/1983 | Arakawa | ................. | 365/185.1 |
| 5,065,201 A * | 11/1991 | Yamauchi | ................. | 365/185.08 |
| 5,716,874 A | 2/1998 | Ko et al. | | |
| 5,969,992 A | 10/1999 | Mehta et al. | | |
| 6,005,806 A * | 12/1999 | Madurawe et al. | ....... | 365/185.23 |
| 6,191,980 B1 * | 2/2001 | Kelley et al. | ............. | 365/185.29 |
| 6,528,842 B1 * | 3/2003 | Luich et al. | ................... | 257/315 |
| 6,788,574 B1 | 9/2004 | Han et al. | | |
| 6,806,529 B1 | 10/2004 | Hopper et al. | | |
| 7,400,169 B2 * | 7/2008 | Zhang | ............................. | 326/81 |
| 2002/0191439 A1 * | 12/2002 | Caywood | ................. | 365/185.06 |
| 2005/0030827 A1 * | 2/2005 | Gilliland et al. | ................. | 365/232 |
| 2005/0099859 A1 * | 5/2005 | Diorio et al. | ................. | 365/200 |
| 2007/0097743 A1 * | 5/2007 | Fang et al. | ............... | 365/185.05 |
| 2007/0241384 A1 * | 10/2007 | Zhu | ............................. | 257/314 |

FOREIGN PATENT DOCUMENTS

WO WO 03/199664 3/2003

OTHER PUBLICATIONS

Hyde et al, *A 300-MS/s 14-bit Digital-to-Analog Converter in Logic CMOS*, 38 IEEE Journal of Solid-State Circuits, 734-740 (May 2003).

Nonvolatile Semiconductor Memory Technology: A Comprehensive Guide to Understanding and Using NVSM Devices, 6-14 (William D. Brown & Joe E. Brewer eds., IEEE Press 1998).

\* cited by examiner

*Primary Examiner* — Dang Nguyen

(74) *Attorney, Agent, or Firm* — Farjami & Farjami LLP

(57) ABSTRACT

According to one exemplary embodiment, a memory cell in a semiconductor chip includes a non-volatile memory transistor, a control gate, and a floating gate. The control gate is capacitively coupled to the floating gate of the non-volatile memory transistor by a metal capacitor. The metal capacitor can be formed in one or more metal levels and in one embodiment is in a shape of a comb with multiple fingers. In one embodiment, the non-volatile memory transistor is an NMOS non-volatile memory transistor.

14 Claims, 5 Drawing Sheets

NON-VOLATILE MEMORY CELL WITH METAL CAPACITOR

BACKGROUND OF THE INVENTION

1. Field of the Invention

The present invention is generally in the field of semiconductor devices. More specifically, the present invention is in the field of semiconductor memory devices.

2. Background Art

Electronic devices utilizing non-volatile semiconductor memory are decreasing in size while requiring an increased amount of non-volatile data storage capacity, creating a need for non-volatile memory cells that can be manufactured inexpensively on a smaller scale. Non-volatile memory cells can be formed using a "double-poly" structure, in which a control gate and a floating gate are each formed in a separate polycrystalline silicon (also referred to as polysilicon) layer. However, double-poly processes are expensive due to the additional manufacturing steps required to form the multiple polysilicon layers.

In one conventional non-volatile memory cell, the gate of a MOS transistor, which acts as a floating gate, is coupled to a MOS capacitor, which acts as a control gate. Although these memory cells do not utilize the costly double-poly process, they tend to consume a very large amount of the semiconductor surface area since the MOS capacitors must be implemented in the semiconductor substrate and laid out laterally to the MOS transistors. Non-volatile memory cells with MOS capacitors also require observing minimum spacing requirements that add to the consumption of the semiconductor area. For example, if a PMOS is utilized as the MOS capacitor and the MOS transistor is an NMOS, a relatively large minimum space between the MOS capacitor NWELL and the N+ diffusions of the NMOS transistor is required to provide adequate electrical isolation, which also causes the memory cell to be larger. In addition, MOS capacitors can suffer from charge leakage through the gate dielectric, as well as junction leakage from the NWELL to the silicon substrate, resulting in a memory cell with decreased data retention reliability.

There is thus a need in the art for a scaleable non-volatile memory cell that occupies a small area of the semiconductor die, can be manufactured at a reduced cost and has improved data retention reliability.

SUMMARY OF THE INVENTION

A non-volatile memory cell with metal capacitor, substantially as shown in and/or described in connection with at least one of the figures, and as set forth more completely in the claims.

DETAILED DESCRIPTION OF THE INVENTION

The present invention is directed to a non-volatile memory cell with metal capacitor. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
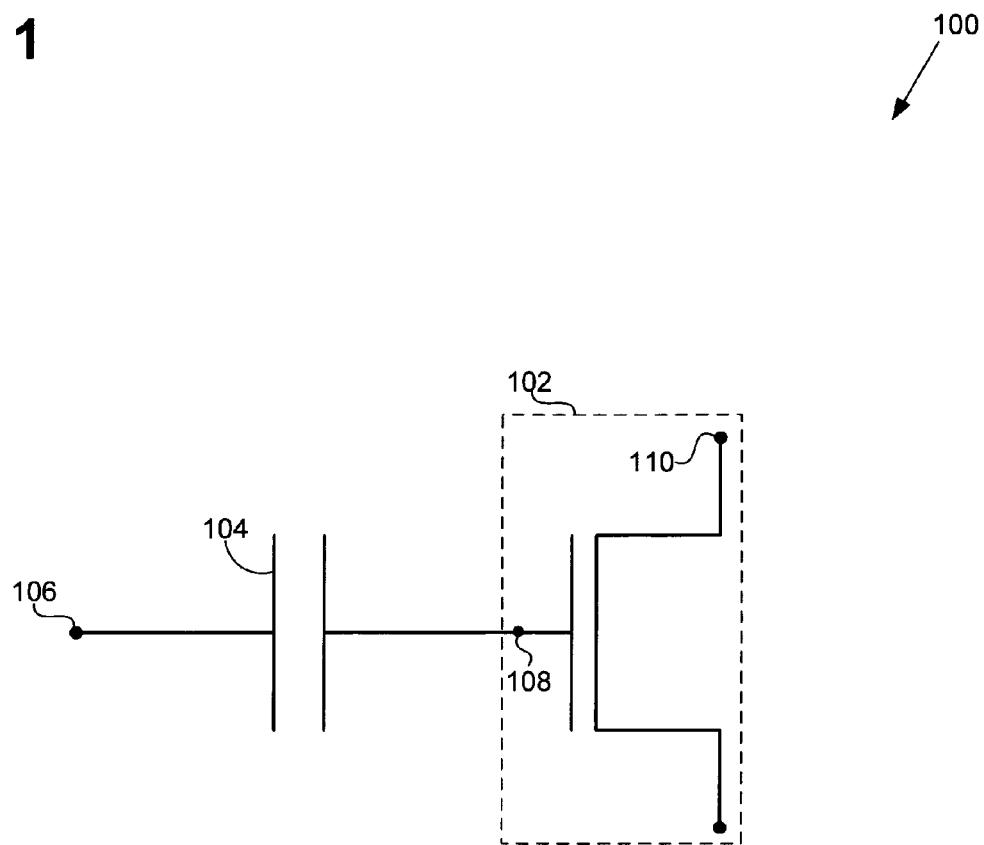
FIG. 1 is a schematic diagram illustrating an exemplary non-volatile memory cell.

FIG. 1 is a schematic diagram illustrating an exemplary non-volatile memory cell 100. Non-volatile memory cell 100 includes non-volatile memory transistor 102, capacitor 104 control gate 106, floating gate 108, and source/drain 110. In non-volatile memory cell 100, floating gate 108 of non-volatile memory transistor 102 is capacitively coupled to control gate 106 by capacitor 104.

Non-volatile memory cell 100 can be programmed and erased by hot carrier injection and/or Fowler-Nordheim tunneling, for example. During a read operation, the voltage at control gate 106 required to turn on non-volatile memory transistor 102 corresponds to a state of non-volatile memory cell 100. For example, a high voltage can correspond to an erased state, and a low voltage can correspond to a programmed state. Thus, the state of non-volatile memory cell 100 can be outputted by source/drain 110 by applying a specific voltage to control gate 106. A double-poly structure, where the control gate and the floating gate are formed in separate polysilicon layers, can be used to fabricate non-volatile memory cell 100. However, the additional fabrication steps required by the double-poly process greatly add to the cost of the non-volatile memory cell.

Figure 2:
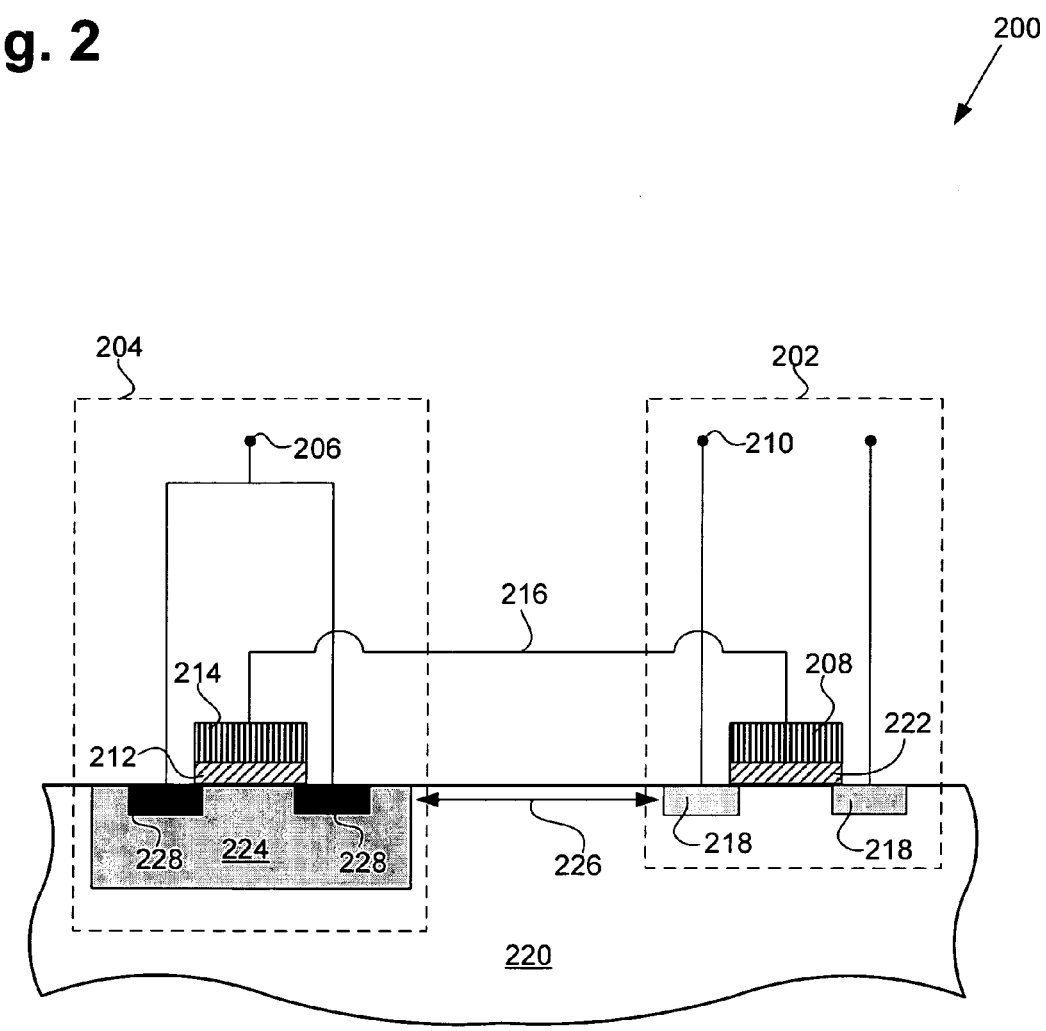
FIG. 2 shows a cross-sectional view of a conventional non-volatile memory cell including exemplary a conventional MOS capacitor.

FIG. 2 shows exemplary conventional non-volatile memory cell 200 including exemplary conventional transistor 202 and capacitor 204 situated on substrate 220. Substrate 220 can be a P type silicon, for example. Transistor 202 can be an n-channel metal-oxide-semiconductor field-effect transistor (NMOS), and capacitor 204 can be a metal-oxide-semiconductor (MOS) capacitor. Non-volatile memory cell 200 further includes control gate 206 which is a first terminal of MOS capacitor 204, floating gate 208 which is the gate of NMOS transistor 202, source/drain node 210, MOS capacitor dielectric 212, MOS capacitor gate 214 which is a second terminal of MOS capacitor 204, source/drain N+ diffusion regions 218 of NMOS transistor 202, transistor gate dielectric 222, N WELL 224 separated from the closest source/drain diffusion region 218 by separation distance 226, and P+ diffusion regions 228. Floating gate 208 of NMOS transistor 202 is coupled to gate 214 of MOS capacitor 204 by what is symbolically shown as interconnect 216.

Non-volatile memory cell 200 operates in a manner similar to that described above in reference to non-volatile memory cell 100 in FIG. 1. NMOS transistor 202, MOS capacitor 204, control gate 206, floating gate 208, and source/drain node 210 correspond, respectively, to transistor 102, capacitor 104, control gate 106, floating gate 108, and source/drain 110 in FIG. 1. More specifically, MOS capacitor 204 capacitively couples control gate 206 of non-volatile memory cell 200 to floating gate 208 of NMOS transistor 202. NMOS transistor 202 can be programmed and erased by hot carrier injection and/or Fowler-Nordheim tunneling, for example, and source/drain node 210 can be used to read out a state of NMOS transistor 202.

Because non-volatile memory cell 200 utilizes a MOS capacitor, it requires high voltages to program and erase the cell. For this and other reasons, distance 226 must be large enough to provide adequate electrical isolation between NMOS transistor 202 and MOS capacitor 204, which increases the size of non-volatile memory cell 200. Since MOS capacitor 204 and NMOS transistor 202 cannot be stacked vertically, the lateral arrangement of the memory cell causes it to occupy a large surface area. Additionally, memory cells utilizing MOS capacitors can suffer from charge leakage through MOS capacitor dielectric 212, as well as junction leakage from N WELL 224 to substrate 220.

Figure 3A:
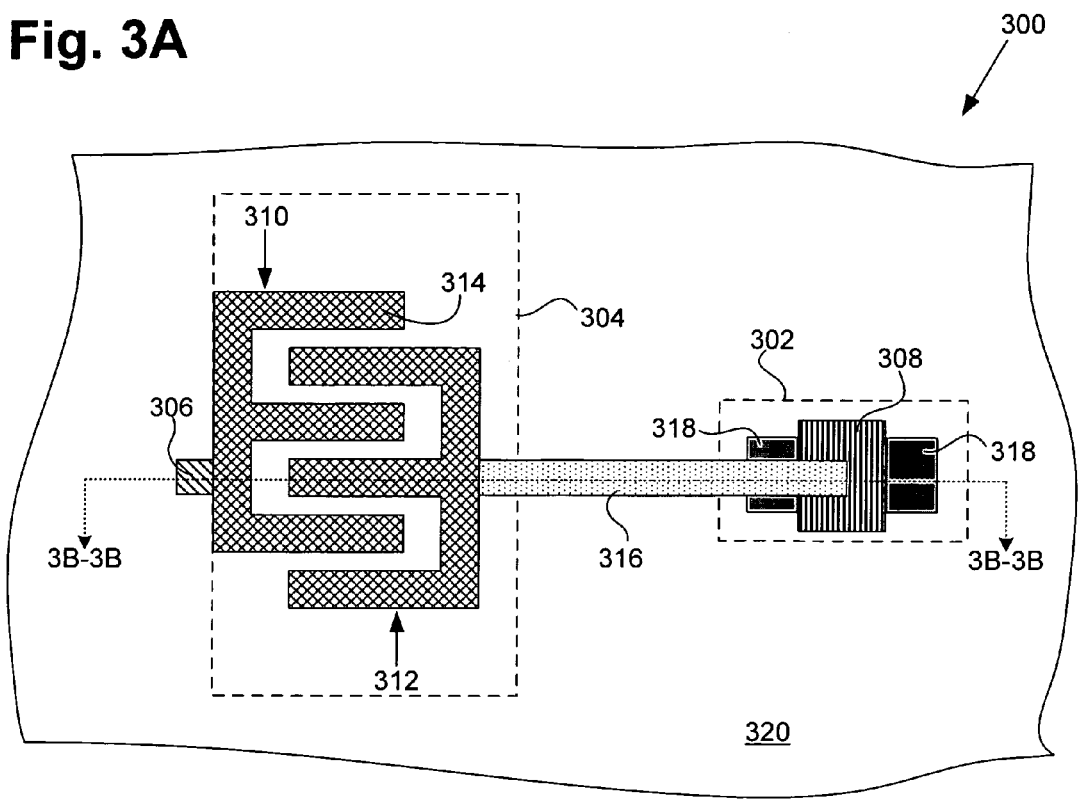
FIG. 3A shows a top view of an exemplary non-volatile memory cell in accordance with one embodiment of the present invention.

FIG. 3A shows a top view of exemplary non-volatile memory cell 300 in accordance with one embodiment of the present invention. Non-volatile memory cell 300 includes non-volatile memory transistor 302, for example NMOS transistor 302, and exemplary metal capacitor 304 situated on substrate 320, which can be a P type substrate. Non-volatile memory cell 300 further includes control gate 306, floating gate 308, first plate 310 of exemplary metal capacitor 304, second plate 312 of exemplary metal capacitor 304, interconnect 316, and N+ diffusion regions 318. Floating gate 308 can be polycrystalline silicon (also referred to as polysilicon), for example. In the present exemplary embodiment, first and second plates 310 and 312 of metal capacitor 304 are shaped as "combs" 310 and 312 and each comprise comb fingers, such as comb finger 314 of capacitor plate 310 (or capacitor comb 310). However, other geometries, sizes and shapes can be used to form the plates of metal capacitor 304.

Moreover, although, for ease of illustration, metal capacitor 304 is shown as a parallel plate capacitor laid out in a single metal level, metal capacitor 304 can be a parallel plate capacitor with plates laid out in different metal levels. For example, plate 310 can be in metal level one, while plate 312 can be laid out in metal level two. Further, each plate itself can be laid out in different metal levels and then interconnected, by vias for example, to form a single electrical plate, such as plate 310. Additionally and in general, any parallel plate metal capacitor configuration known in the art, whether laid out in a single metal level, multiple metal levels, and whether comprising multiple interconnected parallel plates, and formed by any type of metal, such as aluminum, copper, titanium, or metal alloys of various compositions, can be used as metal capacitor 304 in accordance with various embodiments of the present invention.

Figure 3B:
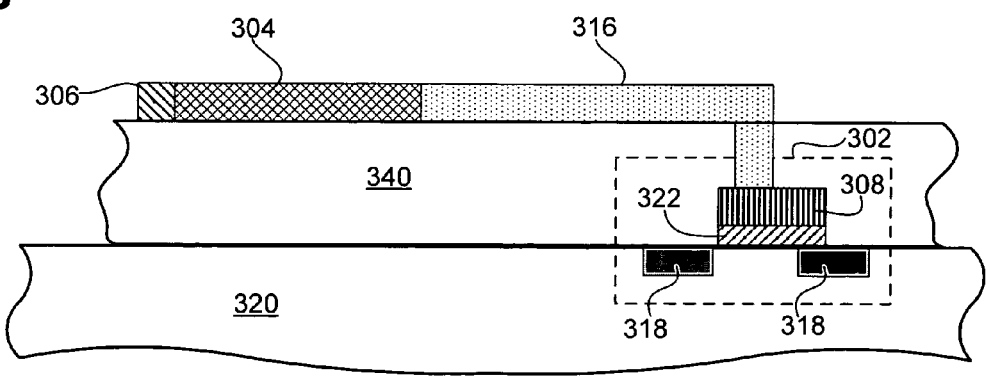
FIG. 3B shows a cross-sectional view of an exemplary non-volatile memory cell in accordance with one embodiment of the present invention.

FIG. 3B shows a cross-sectional view of exemplary non-volatile memory cell 300 along line 3B-3B of FIG. 3A. In particular, NMOS transistor 302, metal capacitor 304, control gate 306, floating gate 308, interconnect 316, N+ diffusion regions 318, and substrate 320 of FIG. 3B are cross-sectional views of the same elements in FIG. 3A. FIG. 3B also shows transistor gate dielectric 322 (not shown in FIG. 3A) formed between floating gate 308 and substrate 320. Further, FIG. 3B shows interlayer dielectric 340 (not shown in FIG. 3A) upon which metal capacitor 304 is patterned. Interlayer dielectric 340 can comprise any dielectrics typically used in the art, for example, silicon oxide or other dielectrics, including various high-k or low-k dielectrics used in the semiconductor industry.

In exemplary metal capacitor 304, first plate 310 and second plate 312 each have three comb fingers, such as comb finger 314. However, as known in the art, any number of comb fingers can be used, and typically a much greater number of comb fingers are used, which are not shown for ease of discussion and illustration. Moreover, other elements are not shown for ease of discussion and illustration. For example, a gate contact for connecting interconnect 316 to floating gate 308 is not shown in FIG. 3A or 3B. It is also noted that although, for ease of illustration, interconnect 316 is shown as landing directly on and contacting floating gate 308 over gate dielectric 322, it is understood in the art that the contact is usually made on an "extension" of floating gate 308 that is situated outside source/drain diffusion regions 318 (e.g., on a polysilicon extension situated on a field oxide region outside of source/drain diffusion regions 318). Further, control gate 306 of non-volatile memory cell 300, shown as extension 306 of capacitor plate 310, can be accessed through underlying devices in substrate 320 or overlying metal levels, or from the same metal level in which metal capacitor 304 is formed. However, for ease of illustration, contacts, vias, or interconnects accessing control gate 306 are not shown in FIG. 3A or 3B.

Metal capacitor 304 can be situated to one side of NMOS transistor 302, as shown, or can be situated directly above NMOS transistor 302. As previously noted, metal capacitor 304 can be patterned and formed as a single-level or a multi-level metal capacitor. A multi-level metal capacitor has a greatly enhanced capacitance density, since it benefits from parallel plate (and fringe) capacitance between the comb fingers of each level, as well as parallel plate (and fringe) capacitance between comb fingers of vertically aligned layers. A multi-level metal capacitor provides a higher capacitance per unit area and can be implemented in a relatively small area of the non-volatile memory cell.

In contrast to the conventional approach of using a MOS capacitor, a metal capacitor can be achieved without consuming the precious semiconductor surface area, since the metal capacitor occupies space above the surface of the die, where much available and unused space exists. In addition, as semiconductor manufacturing processes progress and more metal levels are generally added in semiconductor manufacturing, and as interlayer dielectric thicknesses decrease, metal capacitors' densities will generally increase and also greater number of metal levels can be used to implement a multi-level metal capacitor, which will automatically result in enhanced capacitance density and consumption of a smaller surface area of the non-volatile memory cell. Further, in contrast with the double poly process, fabrication of a non-volatile memory cell utilizing a metal capacitor can be achieved without the great expense and the requirements of a specialized double poly process. Moreover, the conventional problems of charge leakage through a MOS capacitor dielectric and junction leakage between the MOS capacitor well and the substrate present in non-volatile memory cells utilizing MOS capacitors are also eliminated by the invention's novel non-volatile memory cell.

In operation, metal capacitor 304 capacitively couples control gate 306 of non-volatile memory cell 300 to floating gate 308 of NMOS transistor 302. In a manner similar to that described in relation to non-volatile memory cell 100, NMOS transistor 302 can be programmed and erased by hot carrier injection and/or Fowler-Nordheim tunneling, for example, and source/drain diffusion regions 318 can be used to read a state of NMOS transistor 302.

Figure 4A:
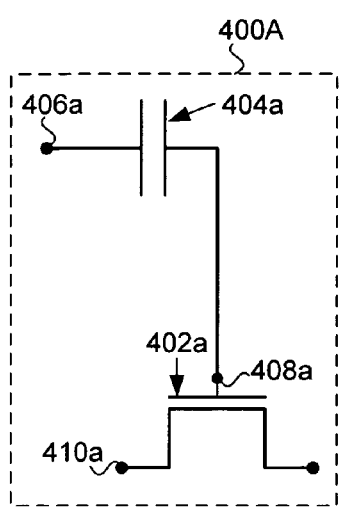
FIG. 4A is a schematic diagram illustrating one exemplary configuration utilizing an embodiment of the invention's non-volatile memory cell.
Figure 4B:
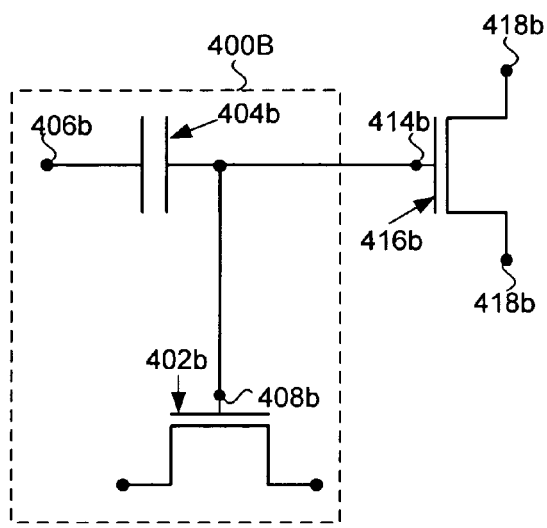
FIG. 4B is a schematic diagram illustrating one exemplary configuration utilizing an embodiment of the invention's non-volatile memory cell.
Figure 4C:
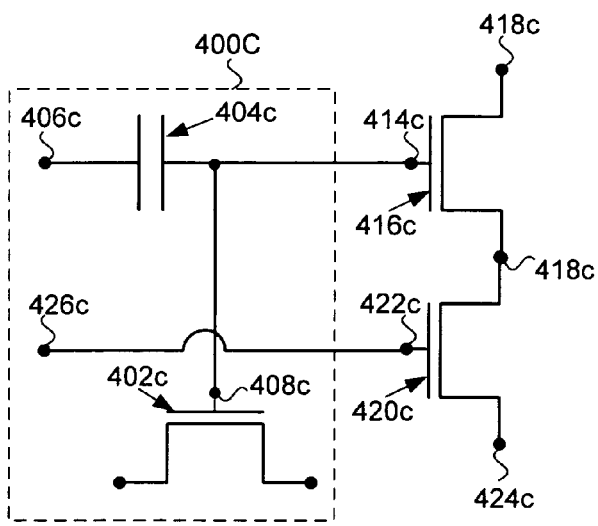
FIG. 4C is a schematic diagram illustrating one exemplary configuration utilizing an embodiment of the invention's non-volatile memory cell.

FIGS. 4A, 4B, and 4C illustrate some exemplary configurations utilizing, respectively, non-volatile memory cells 400A, 400B, and 400C. Each non-volatile memory cell 400A, 400B, or 400C utilizes a non-volatile memory transistor, such as non-volatile memory transistor 302 discussed above (shown as non-volatile memory transistors 402a, 402b, and 402c, respectively), along with a metal capacitor, such as metal capacitor 304 and its various embodiments discussed above (shown as metal capacitors 404a, 404b, and 404c, respectively). Thus, each exemplary non-volatile memory cell 400A, 400B, and 400C can be implemented, for example, in the same manner that was illustrated and described in relation to FIGS. 3A and 3B.

In FIG. 4A, non-volatile memory cell 400A includes non-volatile memory transistor 402a, metal capacitor 404a, control gate 406a, floating gate 408a, and source/drain 410a. Floating gate 408a of non-volatile memory transistor 402a is capacitively coupled to control gate 406a by metal capacitor 404a. Non-volatile memory transistor 402a can be an n-channel metal-oxide-semiconductor field-effect transistor (NMOS), for example, such as NMOS transistor 302 of FIG. 3A in one embodiment. Metal capacitor 404a can be configured with metal plates shaped as a comb with multiple comb fingers, for example, such as metal capacitor 304 of FIG. 3A in one embodiment. In a manner similar to that described in FIG. 1, source/drain 410a is utilized to sense or read the state of non-volatile memory transistor 402a.

In FIG. 4B, non-volatile memory cell 400B includes non-volatile memory transistor 402b, metal capacitor 404b, control gate 406b, and floating gate 408b. Floating gate 408b of non-volatile memory transistor 402b is capacitively coupled to control gate 406b by metal capacitor 404b. Non-volatile memory transistor 402b can be an n-channel metal-oxide-semiconductor field-effect transistor (NMOS), for example, such as NMOS transistor 302 of FIG. 3A in one embodiment. Metal capacitor 404b can be configured with metal plates shaped as a comb with multiple comb fingers, for example, such as metal capacitor 304 of FIG. 3A in one embodiment. In the configuration of FIG. 4B, gate 414b of readout transistor 416b is coupled to floating gate 408b. In this configuration, readout transistor 416b, and in particular source/drain 418b of the readout transistor, will be used to sense or read the state of non-volatile memory transistor 402b. It is noted that in the configuration of FIG. 4A, repeated programming and erasing can cause electrical charges to be trapped in the gate dielectric of non-volatile memory transistor 402a, which can degrade readout reliability. In the configuration of FIG. 4B, separating the readout function from the program and erase functions improves reliability at the expense of increasing the size of the memory array.

In FIG. 4C, non-volatile memory cell 400C includes non-volatile memory transistor 402c, metal capacitor 404c, control gate 406c, and floating gate 408c. Floating gate 408c of non-volatile memory transistor 402c is capacitively coupled to control gate 406c by metal capacitor 404c. Non-volatile memory transistor 402c can be an n-channel metal-oxide-semiconductor field-effect transistor (NMOS), for example, such as NMOS transistor 302 of FIG. 3A in one embodiment. Metal capacitor 404c can be configured with metal plates shaped as a comb with multiple comb fingers, for example, such as metal capacitor 304 of FIG. 3A in one embodiment. In the configuration of FIG. 4C, gate 414c of readout transistor 416c is coupled to floating gate 408c. In this configuration, readout transistor 416c, and in particular source/drain 418c of the readout transistor, will be used to sense or read the state of non-volatile memory transistor 402c. In addition, gate 422c of select transistor 420c is driven by select input 426c. When select input 426c (e.g. a word line in a memory array) is active, the sensed (or read) state at source/drain 418c is selected to be outputted.

In the configuration of FIG. 4C, like configuration 4B, separating the readout function from the program and erase functions improves reliability at the expense of increasing the size of the memory array. Moreover, select transistor 420c provides an additional capability and flexibility to provide output only from selected non-volatile memory transistors. However, this extra transistor further adds to the size and complexity of configuration 4C. It is noted that all of the configurations shown in FIGS. 4A, 4B, and 4C exhibit and enjoy the advantages resulting from the use of a metal capacitor, instead of a MOS capacitor and in place of using a double poly process, as discussed above in relation to non-volatile memory cell 300 and in relation to FIGS. 3A and 3B.

Figure 5:
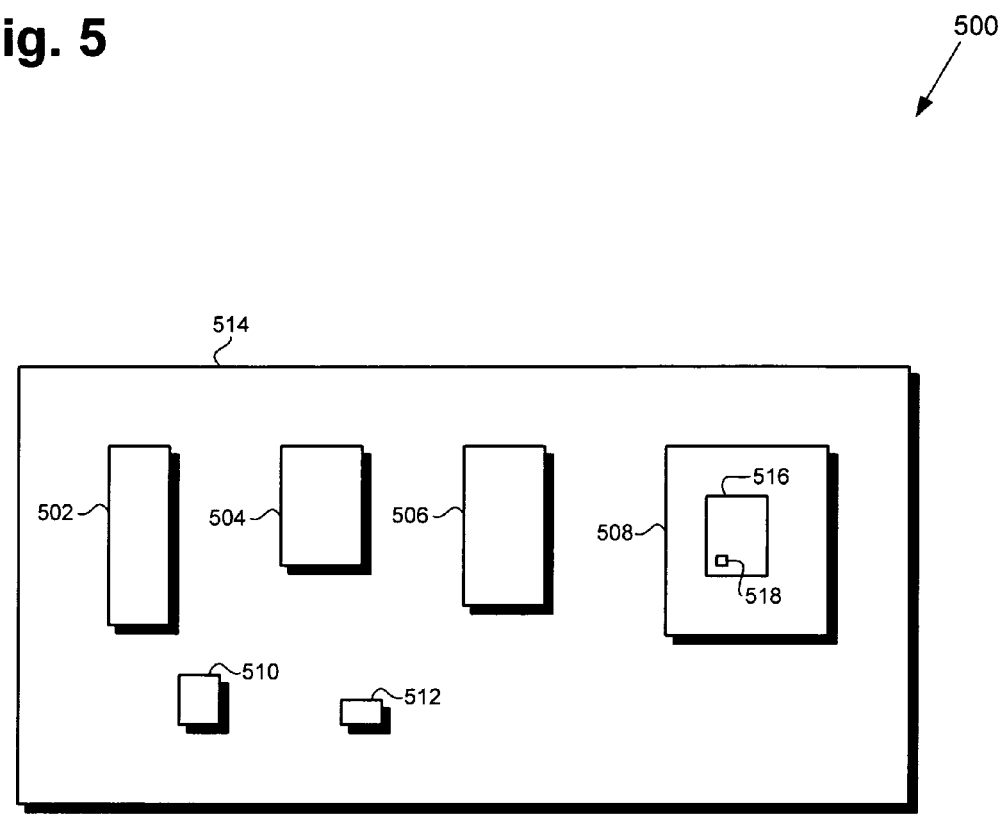
FIG. 5 illustrates a diagram of an exemplary electronic system including an exemplary semiconductor chip or die utilizing one or more of the invention's non-volatile memory cells.

FIG. 5 illustrates a diagram of an exemplary electronic system including an exemplary semiconductor chip or die utilizing one or more non-volatile memory cells in accordance with one embodiment of the present invention. Electronic system 500 includes exemplary modules 502, 504, and 506, IC semiconductor chip 508, discrete components 510 and 512, residing in and interconnected through printed circuit board (PCB) 514. In one embodiment, electronic system 500 may include more than one PCB. IC chip 508 includes circuit 516, which utilizes one or more of the invention's non-volatile memory cells designated by numeral 518.

As shown in FIG. 5, modules 502, 504, and 506 are mounted on PCB 514 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electro-mechanical motor control module, or a field programmable gate array (FPGA), or any other kind of module utilized in modern electronic circuit boards. PCB 514 can include a number of interconnect traces (not shown in FIG. 5) for interconnecting modules 502, 504, and 506, discrete components 510 and 512, and IC chip 508.

Also shown in FIG. 5, IC chip 508 is mounted on PCB 514 and can be, for example, any chip utilizing an embodiment of the present invention's non-volatile memory cells. In one embodiment, IC chip 508 may not be mounted on PCB 514, and may be interconnected with other modules on different PCBs. As stated above, circuit 516 is situated in IC chip 508 and includes one or more embodiments of the invention's non-volatile memory cells 518. Further shown in FIG. 5, discrete components 510 and 512 are mounted on PCB 514 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor. Discrete components 510 and 512 may themselves utilize one embodiment of the invention's non-volatile memory cells.

Electronic system 500 can be utilized in, for example, a wired or wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring equipment, a digital avionics device, a medical device, or a digitally-controlled medical equipment, or in any other kind of system, device, component or module utilized in modern electronics applications.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus a non-volatile memory cell with metal capacitor has been described.

The invention claimed is:

1. A memory cell residing in a semiconductor chip, said memory cell comprising:
a non-volatile memory transistor comprising a floating gate;
a control gate being capacitively coupled to said floating gate by a metal capacitor comprising interconnect metal formed in one metal level of said semiconductor chip over an interlayer dielectric;
a metal interconnect coupling said metal capacitor and said floating gate, said metal interconnect formed in said one metal level;
wherein a state of said non-volatile memory transistor is read through a readout transistor coupled to said floating gate of said non-volatile memory transistor and a select transistor in series with said readout transistor.

2. The memory cell of claim 1 wherein said metal capacitor is shaped as a comb with a plurality of fingers.

3. The memory cell of claim 1 wherein said metal capacitor is formed in at least two metal levels of said semiconductor chip.

4. The memory cell of claim 1 wherein said metal capacitor comprises a plurality of metal plates, one of said plurality of metal plates having a control gate extension formed in said one metal.

5. A memory cell residing in a semiconductor chip, said memory cell comprising:
a non-volatile memory transistor comprising a floating gate;
a control gate being capacitively coupled to said floating gate by a metal capacitor comprising interconnect metal formed in one metal level of said semiconductor chip over an interlayer dielectric;
a metal interconnect coupling said metal capacitor and said floating gate, said metal interconnect formed in said one metal level;
wherein said metal capacitor is situated to one side of said floating gate such that no portion of said metal capacitor is situated directly above said floating gate.

6. The memory cell of claim 5 wherein said metal capacitor is shaped as a comb with a plurality of fingers.

7. The memory cell of claim 6 wherein said metal capacitor is formed in at least two metal levels of said semiconductor chip.

8. The memory cell of claim 5 wherein said metal capacitor comprises a plurality of metal plates, one of said plurality of metal plates having a control gate extension formed in said one metal level.

9. The memory cell of claim 5 wherein a state of said non-volatile memory transistor is read through a readout transistor and a select transistor coupled to said non-volatile memory transistor.

10. An electronic system comprising:
a semiconductor chip comprising at least one memory cell, said at least one memory cell comprising:
a non-volatile memory transistor comprising a floating gate;
a control gate being capacitively coupled to said floating gate by a metal capacitor comprising interconnect metal formed in one metal level of said semiconductor chip over an interlayer dielectric;
a metal interconnect coupling said metal capacitor and said floating gate, said metal interconnect formed in said one metal level;
wherein a state of said non-volatile memory transistor is read through a readout transistor coupled to said floating gate of said non-volatile memory transistor and a select transistor in series with said readout transistor.

11. The electronic system of claim 10 wherein said metal capacitor is shaped as a comb with a plurality of fingers.

12. The electronic system of claim 10 wherein said metal capacitor is formed in at least two metal levels of said semiconductor chip.

13. The memory cell of claim 10 wherein said metal capacitor comprises a plurality of metal plates, one of said plurality of metal plates having a control gate extension formed in said one metal level.

14. The electronic system of claim 10 wherein said electronic system is selected from the group consisting of a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), digital game playing device, a digital testing and/or measuring device, a digital avionics device, a medical device, and a digitally-controlled medical equipment.

* * * * *